United States Patent [19]

Maas et al.

[11] Patent Number: 5,152,322
[45] Date of Patent: Oct. 6, 1992

[54] VALVE BLOCK ASSEMBLY

[75] Inventors: Joachim Maas, Griesheim; Erhard Beck, Darmstadt; Winfried Schuetzeichel; Bad Vilbel; Axel Hinz, Kronberg, all of Fed. Rep. of Germany

[73] Assignee: Alfred Teves GmbH, Frankfurt Am Main, Fed. Rep. of Germany

[21] Appl. No.: 837,457

[22] Filed: Feb. 18, 1992

Related U.S. Application Data

[60] Division of Ser. No. 622,214, Nov. 30, 1990, which is a continuation of Ser. No. 399,468, Aug. 10, 1989, abandoned.

[30] Foreign Application Priority Data

| Dec. 14, 1987 | [DE] | Fed. Rep. of Germany | 3742320 |
| Apr. 20, 1988 | [DE] | Fed. Rep. of Germany | 3813140 |
| Apr. 20, 1988 | [DE] | Fed. Rep. of Germany | 3813141 |
| Dec. 5, 1988 | [WO] | PCT Int'l Appl. | PCT/EP88/01107 |

[51] Int. Cl.$^5$ ............................................. F16K 15/00
[52] U.S. Cl. ..................................... 137/884; 137/560
[58] Field of Search .......................... 137/884, 560; 251/129.15; 439/722, 723, 893; 200/303

[56] References Cited

U.S. PATENT DOCUMENTS

| 1,160,386 | 11/1915 | Crouse | 434/893 X |
| 3,717,179 | 2/1973 | Clark | 439/723 X |
| 4,247,047 | 1/1981 | Schaming | 137/884 X |
| 4,387,739 | 6/1983 | Schaming | 137/884 |
| 4,557,292 | 12/1985 | Nicolas | 137/884 X |
| 4,678,006 | 7/1987 | Northman et al. | 137/884 X |
| 4,785,848 | 11/1988 | Leiber | 137/884 X |
| 4,889,164 | 12/1989 | Hazumi et al. | 137/884 X |
| 4,909,750 | 3/1990 | Neumann | 439/722 X |
| 4,913,189 | 4/1990 | Kline et al. | 137/560 |

FOREIGN PATENT DOCUMENTS

| 57078 | 4/1985 | Japan | 137/884 |

*Primary Examiner*—John C. Fox
*Attorney, Agent, or Firm*—Robert P. Seitter; J. Gordon Lewis

[57] ABSTRACT

A valve block assembly for an anti-lock assembly for anti-lock system for automotive vehicles. The assembly comprises a valve-receiving member (1) and a cover 92). The cover is made of plastics into which conducting paths are injection-molded. The conducting paths are part of a stamping (13). When the cover (2) is mounted on the valve-receiving member (1), all contacts are established between the pins (18) of the coils of the solenoid valves (19), on the one hand, and the erected ends (15) of the stamping (13), on the other hand. The instant invention accomplishes considerable simplification of the assembly.

18 Claims, 6 Drawing Sheets

VALVE BLOCK ASSEMBLY

This is a divisional of co-pending application Ser. No. 07/622,214 filed on Nov. 30, 1990 which is a continuation of application Ser. No. 07/399,468 filed on Aug. 10, 1989 (abandoned).

The present invention relates to a valve block assembly for braking pressure regulating devices, such as anti-lock control devices, and traction slip control device. The assembly includes one or more electromagnetically acutatable hydraulic solenoid valves, a valve block cover, and a power-supply means for energizing the coils of the solenoid valves.

BACKGROUND OF THE INVENTION

Electrohydraulic control arrangements have been increasingly used in the field of engineering. The reason therefor is the possibility of providing the control part of a control chain to be of an electrical configuration and the energy part of the control chain to be of a hydraulical configuration. The electromagnetically actuated hydraulic valves represent the points of connection between electric and hydraulic components. These valves are combined to form assembly groups or valve blocks. These assembly groups include hydraulic inlet and outlet lines and of one or more outgoing cables. The cables incorporate electrical lines for the control signals for switching the electromagnetic valves, that is for engergizing the coils of the solenoid valves.

Systems of this type are described in German patent application P37 42 830.6. This patent application describes a valve block assembly composed of one or more electromagnetically actuatable hydraulic valves (solenoid valves), a valve cover, and a power-supply means for energizing the coils of the solenoid valves.

The special feature of the valve block assembly of this patent application resides in that there is provision of a printed circuit board which, as a construction unit, can be mounted on all electrical contacts of the coils, which comprises electrical conducting paths that establish the electric connections between the coils and an outgoing cable of the valve block. The circuit board for the outgoing cable includes a contact device which is common to all conducting paths and which is arranged so that the dismountable plug contact plug of the connecting cable can be plugged directly on the circuit board which forms part of the contact device.

German patent application P 37 01 019.0 depicts a valve block for a slip-controlled hydraulic brake system comprising a valve-receiving member accommodating several solenoid valves, a frame, a cover closing the frame and a plug assembly containing a plurality of contact blades, the solenoid valves being coupled to the contact blades by a contacting foil. The special characteristic of this valve block is that the frame is designed integrally with the cover and the plug assembly in such a fashion that a one-part cover unit is formed which permits soldering the contacting foil and is fixed on the valve-receiving member in a sealed manner.

SUMMARY OF THE INVENTION

Arrangements of the this type composed of a valve block and an associated cover entail the following problems in practice: Difficulties occur when the mounting cover on the valve block by machine. Automatic mounting is possible only in a very intricate fashion. The automatized assembly of valve block and cover present centering and sealing problems. Further, securing and sealing of the electrical lines for the coils of the solenoid valves introduces additional problems.

The present invention has the following objects: The shortcomings of the state of the art described herein are to be eliminated. The valve block assembly is to be of a simpler design. The assembly is to be facilitated and, more particularly, a simplified automatic assembly of the unit is to be possible. Manufacture is to be less costly. Especially the mechanical mounting of the cover on the valve block is to be facilitated. It is achieved by the present invention that the plug of the circuitry is integrated in the cover, that is, it forms a unit together with this cover. Problems of sealing between cover and plug are circumvented thereby. This invention provides a basis for integrally forming the plug and cover. Further, it is an object of the present invention that soldering becomes superfluous and that hence flaws in soldering entailing costs are avoided. Dismounting the cover and the conducting paths is provided in order to permit ease of exchange of the coils, especially upon the occurrence of defects. Further, the instant invention provides a compensation of tolerances between the contacts of the cover and those of the coils of the solenoid valves. The points of contact of the cover are resiliently arranged. Additionally it is an object of the present invention that installation times are shortened and that the entire line system is more short-circuit proof. Good precautions for automatizing the assembly of the cover are to be attained, and simultaneously mounting of the cover and the conducting path system. Further, by retroactive exchange of the cover, other circuitries or plug connections, in particular in the area of the coils points of contact, can be realized. Finally, it is a further object of the present invention that the conducting paths are largely protected and that no damage of the conducting paths occurs during the intermediate assembly. Screw couplings are avoided. Sealing between valve block and cover becomes unnecessary. Nevertheless, the electrical contacts are protected against humidity and contamination. A quick and simple assembly of the cover is enabled.

This and other objects are achieved in that the cover consists of a material permitting the accommodation of electrical lines, and in that the power-supply means is incorporated in the cover material. The instant invention provides a particularly cost-efficient power-supply means comprising conducting paths which are cast into the cover, the latter consisting preferably of plastics. Further, for the reduction of manufacturing costs, the conducting paths are part of a stamping, in particular a stamped grid.

A good tolerance compensation between the points of contact of the cover, on the one hand, and the coils of the solenoid valves, on the other hand, is accomplished during the assembly in that the stamping includes at least one erected end which, preferably, is of resilient design and forms a contact element for at least one coil of the solenoid valves. For further simplifying the manufacture, it is provided that stamping includes an erected resilient end which forms a plug-connector element, in particular, a contact blade which constitutes an electrical connection of the valve block assembly to the outside.

The following advantages are accomplished by the present invention: The plug-connector element leading from the valve block to the outside is integrated in the cover of the valve block, without sealing problems as a result. Further, no additional soldering actions are necessary, whereby flaws in soldering and correlated costs are avoided. The resilient ends of the stamped grid ensure a good tolerance compensation in making the electrical connection. The fact that the stamped grid is integrated in the cover saves additional installation time, the entire system becomes more short-circuit-proof. The soldering actions known so far and the problems and defects ensuing therefrom are deleted. The assembly of the cover with stamped grid can be automated. For substitution of defective coils, it is merely required to dismount the cover with the integrated printed circuit board.

Another advantage is that the cover comprises an integral component part the power-supply means, in particular the circuitry composed of electrical conducting paths, preferably together with the contact element of the power-supply means which leads outwardly.

The instant invention also provides other circuitries or plug assemblies by retroactively exchanging the cover. The conducting paths are protected in the inventive arrangement and are not easily damaged during the intermediate assembly. A design of the invention which lends itself to particular ease of manufacture is provided in that conducting paths are provided for energization which are part of a stamping, in particular a stamped grid. It also can be arranged that the conducting paths are fastened to the cover bottom, preferably in positive engagement therewith. The fixing elements can be designed as clips or as snap hooks. A particularly cost-efficient type of construction results in that the stamping comprises at least one erected end which, preferably, is of resilient design, and forms a contact element for at least one coil of the solenoid valves.

To constitute an electrical connection to the outside, the stamping comprises at least one erected end which, preferably, is of resilient design, and forms a contact element, in particular a resilient plug element, for the electrical contact with an electrical connecting means, in particular a contact blade. In order to simplify the assembly, at least one fixing element is an integral part of the cover. A fixing element in the type of a press fastener can also be used in lieu of clips or snap hooks.

The objects set forth hereinabove are achieved by the present invention in that the cover is designed as a member accommodating one or more electrical liens or conducting paths which serve to energize the coils of the solenoid valves. In another embodiment of the present invention the cover is furnished with one or more elements (contact elements) for making the electrical contacts between the electric conductors and the coils of the solenoid valves. A preferred embodiment provides that one or more electric conductors are formed by electrically conductive material, in particular by sheet brass, which is cast into the cover that preferably consists of plastics. Preferably, the contact elements can be contact pins or contact plugs which are designed as parts shaped at the conductive material. The cover in its entirety can be mounted on the valve block, while it simultaneously establishes all electrical contacts and is positively engaged with the valve block. This positive engagement can be effected by angle bars which are fastened to the cover and which engage on the valve block. In another embodiment of the present invention there is provision of pins which are shaped on the inside of the cover and which establish an electrical connection with plugs fitted on the coils of the valve block. In an alternative embodiment, plugs are shaped on the inner side of the cover which form electrical contacts with pins mounted on the coils of the valve block. The electrical conductors in the cover are interlaced according to the wiring arrangement and are in connection with a multiple contact plug mounted on the outside of the cover.

In order to obtain protection of the electrical contacts, there is provision of rubber-sponge elements or soft-rubber elements which seal the plug-and-pin connections relative to moisture and dirt and which are located during the cover assembly between the cover and the solenoid valves, in particular the coils of the solenoid valves.

This invention attains the following advantages: The above-described drawbacks of the prior art are avoided. Improved conditions are created for mounting the cover on the valve block by machine. Sealing and centering problems ae eliminated which were caused by previously known manufacturing and assembling methods. There is thereby provided a reliable fastening of electrical lines and sealing thereof. By virtue of this invention, there is provided an assembly composed of valve block and cover which has a comparatively small space requirement particularly when the cover must be lifted from the valve block.

BRIEF DESCRIPTION OF THE DRAWINGS.

Further details of this invention can be gathered from the following description of four embodiments which are illustrated in the accompanying drawings in which.

DETAILED DESCRIPTION OF THE PREFERRED AND ALTERNATIVE EMBODIMENTS

Figure 1:
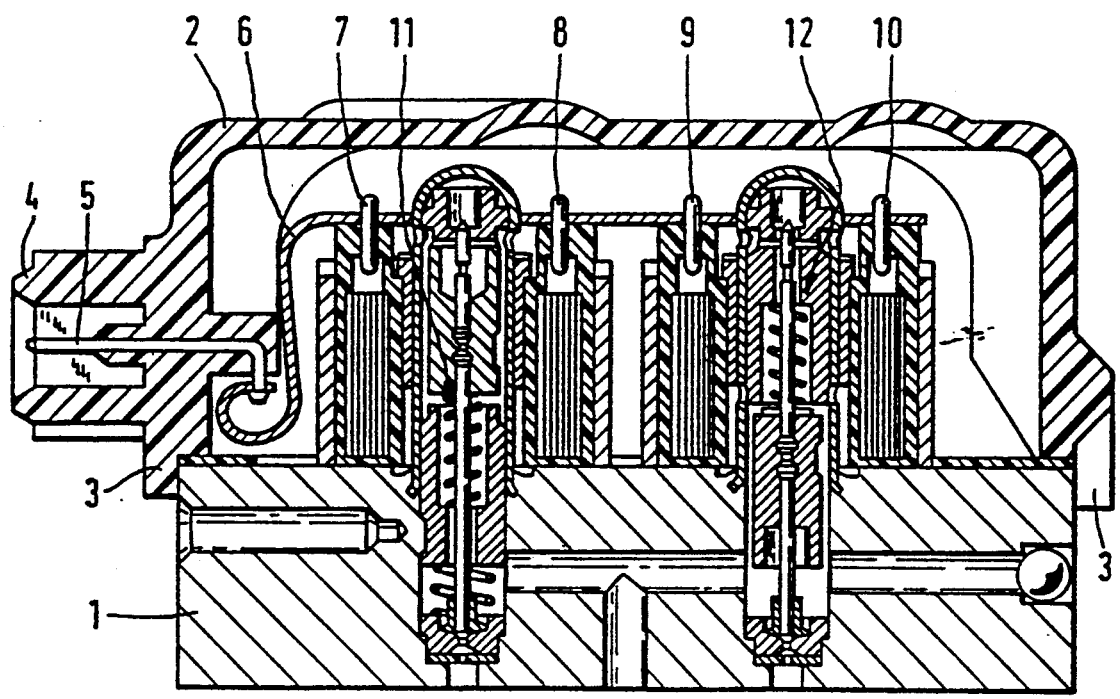
FIG. 1, shows an assembly composed of a valve-receiving member and an associated cover.

FIG. 1 shows a prior-art valve block assembly which is improved by this invention. The valve block assembly according to FIG. 1 comprises a valve-receiving member 1 and a cover 2. Disposed on the cover 2 are a frame 3 and a cover attachment 4 with a contact blade 5. Reference numeral 6 designates a contacting foil which interconnects the contact pins 7, 8, 9 and 10 and the contact blade. This contacting foil contains corresponding electrical lines. Numeral 11 designates a solenoid valve which is open in its de-energized state (SO-valve). Element 12 is a solenoid valve which is closed in its de-energized state (SG-valve).

Figure 2:
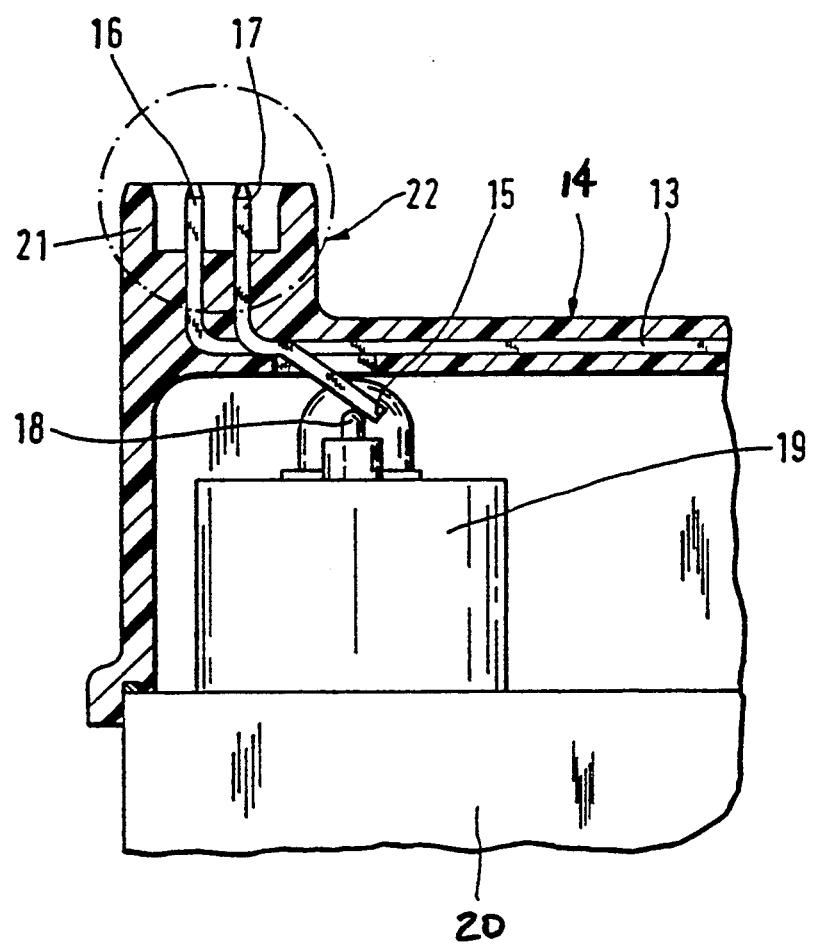
FIG. 2, shows in a partial cross-sectional view the first embodiment of a valve block cover.

The assembly of the valve block assembly according to known configurations is carried out as follows. First, solenoid valves are assembled. Subsequently, the conducting foil or a circuit board is applied and soldered with the contact pins. Finally, the assembly is closed by the cover. This process is improved by the present invention. In the embodiment of the invention according to FIG. 2, the conducting paths are part of a stamping 13. This stamping is provided as a stamped grid. The stamped grid is injection moulded in the cover 14 made of plastics. The resilient end of the stamped grid 15 as well as the ends 16, 17 are designed as contact elements. The erected end 15 is in resilient contact with the pin 18 of the coil of solenoid valve 19. The solenoid valve is incorporated in the valve block 20.

The ends 16, 17 of the stamped grid are designed as contact blades. They are accommodated inside the cover attachment 21. The blades form a plug-connector element for the outer connection of the conducting paths. In its entirety, the plug-connector element is referred to as 22.

In the state of the art as illustrated in FIG. 1, the solenoid valves are mounted in the steel valve block 1. Subsequently, the conducting foil and/or a circuit board is applied. Afterwards, the conducting paths are soldered with the pins of the coils. Still later, the assembly is closed by the cover 2.

In accordance with the present invention, in one process, the cover with all conducting paths is mounted onto the valve block and, simultaneously, all contacts are established between pins 18 of the coil of the solenoid valves 19, on the one hand, and the erected ends 15 of the stamped grid 13 on the other hand.

According to the further embodiments of the present invention, a valve block cover with integrated circuitry and integrated plug is provided which, are mounted on the valve-receiving member. The conducting paths consist of one or more stampings, such as a plurality of stamped grids which are fixed in the cover bottom. This fixation, which are described herein with respect to a stamping, is performed by means of clips or by snap hooks. Furthermore, erected ends are provided which constitute a resilient contact to the coils of the solenoid valves and to the plug. The conducting paths 114, 115, 116, 117, 24, 25, 26, 29, 30 shown in FIGS. 3 to 7 are components of a stamped grid.

Figure 3:
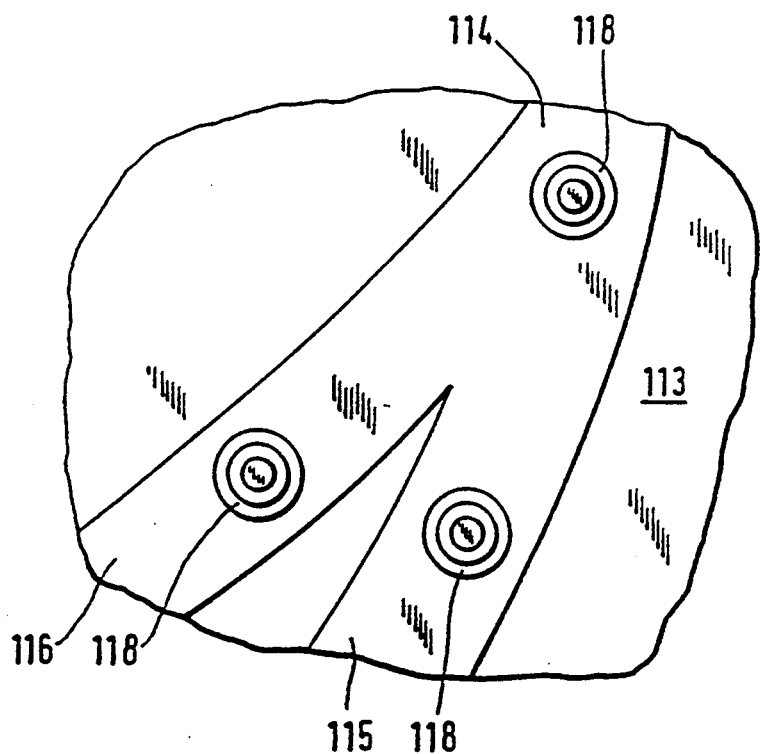
FIGS. 3 and 4, show a portion of the cover bottom which is designed according to the second embodiment.
Figure 4:
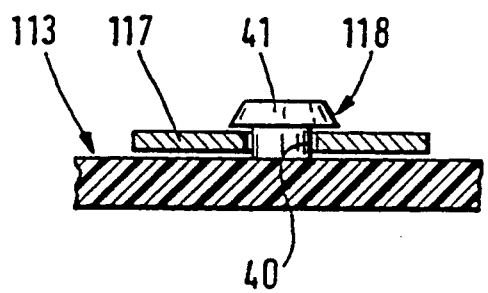

FIG. 3 shows a section of the cover bottom 113 in which the conducting paths 114, 115, 116 are fitted on the cover bottom. As can be seen from FIG. 4, the conducting path 117 is fixed to the cover bottom 113 by means of a clip 118. The clip and cover are made of one material which form one element. The fixation of the conducting path on the cover bottom is effected by being 'buttoned' thereinto, as illustrated in FIG. 4. The term "buttoning" as used herein means that the conducting path 117 is slid over the head 41 of the clip 118 and catches the crank 40 of the clip. The clip and the cover are made of plastics.

Figure 5:
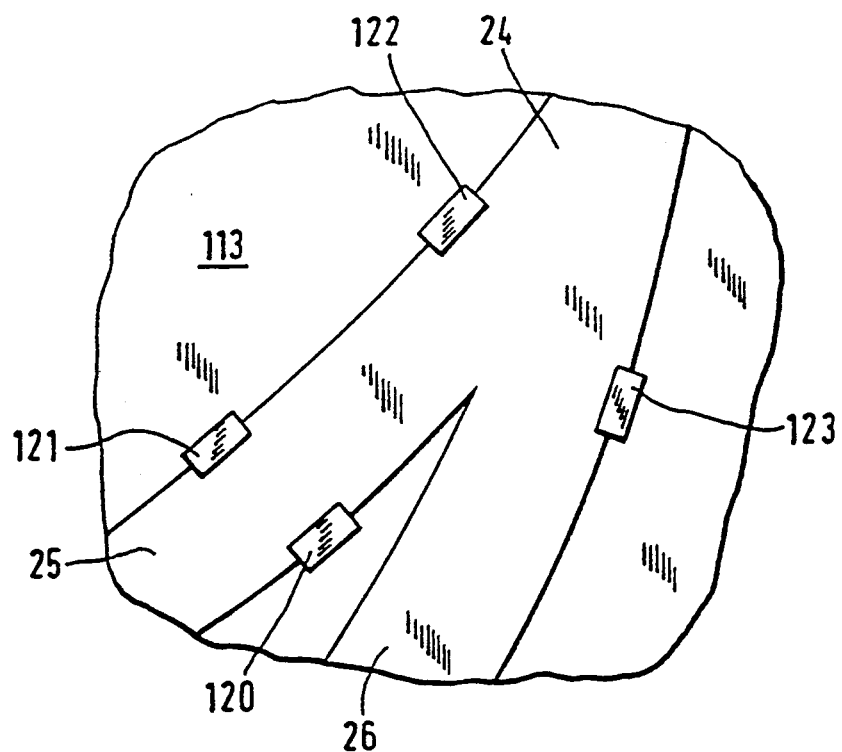
FIGS. 5 and 6, show a portion of the cover bottom which is designed according to the third embodiment.
Figure 6:
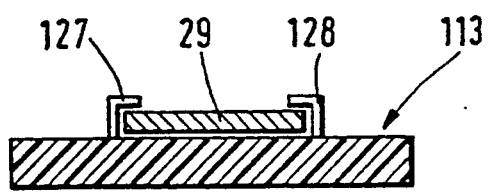

In the embodiment according to FIGS. 5 and 6, snap hooks 120, 121, 122, 123 are utilized. By means of these snap hooks, the conducting paths 24, 25, 26, 29 are fastened to the cover bottom 113. These snap hooks are elastic in that they allow bending outwardly in respect of the conducting path. Subsequently, the conducting path is applied on the cover bottom. Due to their elasticity, the snap hooks 127, 128 move back into their initial position and thus secure the conducting path 29, as in FIG. 6. The snap hooks consist of the same material (plastic) like the cover and, together with the cover, form one part. The cover consist of the same material plastics like the cover and, together with cover, form one part. The snap hooks can be arranged in opposite relationship, such as snap hooks 120, 121, or in offset relationship, such as snap hooks 122, 123.

Figure 7:
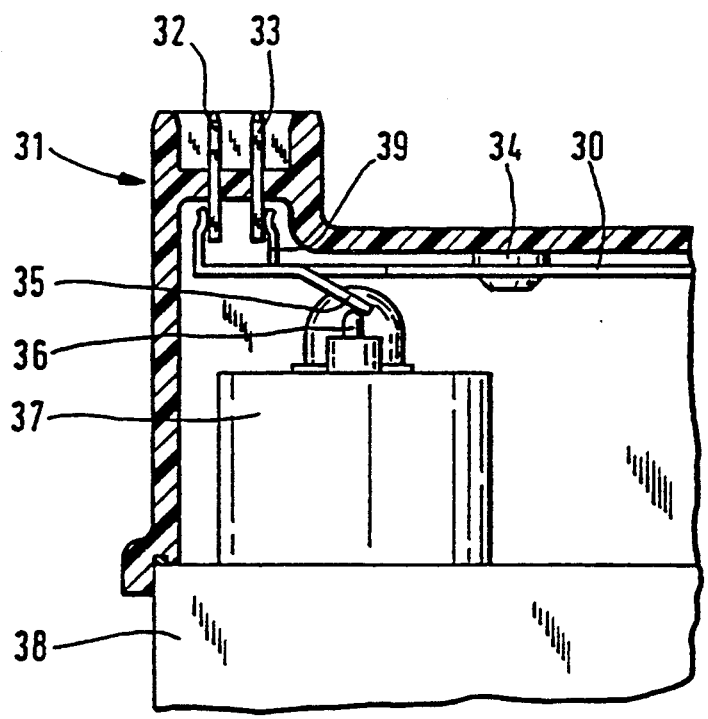
FIG. 7, shows the partial view of a valve block assembly in a design according to the second embodiment.

The cover is illustrated in cross-section in FIG. 7. It comprises a cover attachment 31 which incorporates the contact blades 32, 33. Reference numeral 30 designates a conducting path. As is illustrated, this conducting path is part of a stamped grid. Therefore, this stamped grid is likewise assigned reference numeral 30 in FIG. 7. This stamped grid 30 is among others secured to the cover by the clip 34. The conducting paths embodied by the stamped grid have erected resilient ends, one 35 of which is shown. This erected end 35 forms an electrical contact together with the contact pin 36 of the coil of the solenoid valve 37. The solenoid valve is housed in the valve-receiving member 38. The stamped grid 30 is designed as a resilient plug device 39 in the area of the cover attachment 31. This plug device resiliently abuts on the contact blades 32, 33. An electrical connection to the outside is thereby provided.

Figure 8:
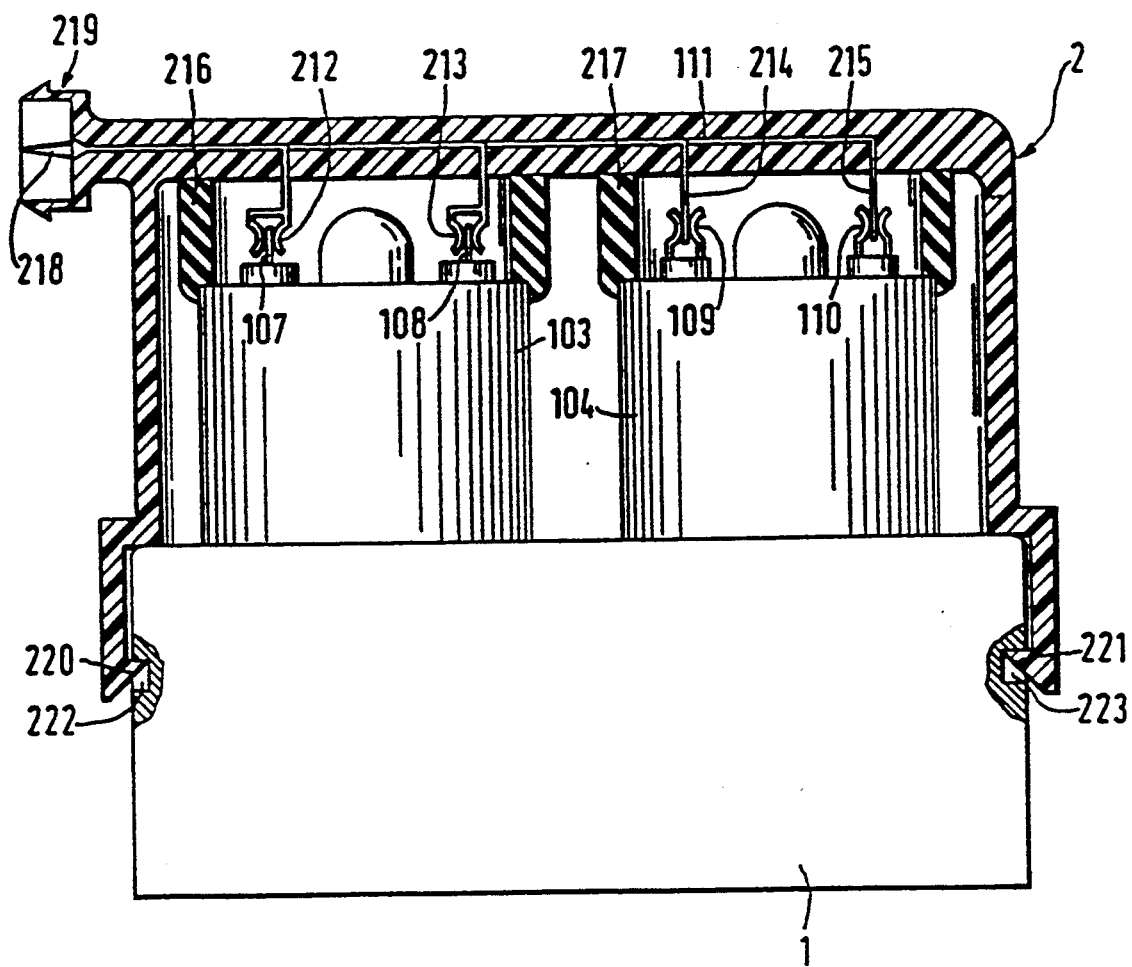
FIG. 8, shows the cross-sectional view of the fourth embodiment, that is of a cover for a valve-receiving member and the valve-receiving member itself.

In the embodiment illustrated in FIG. 8, the coil 103 placed on the left hand is furnished with the previously described pins 107, 108 while plugs 109, 110 are provided as contact elements in the coil 104 placed on the right hand. The cover consist of plastics in the present embodiment. A brass sheet 111 is cast into the plastic cover 2. This brass sheet forms elastical conductors or conducting paths which are likewise referred to by 111 in the Figure. These conductors or conducting paths 111 serve to energize the coils 103, 104. The instant ebodiment provides solenoid valves for anti-lock braking systems.

The brass sheet 111 is cast into the plastic cover 2, that is, the conductors or conducting paths consisting of brass sheet, comprise shaped elements which are designed either as plugs 212, 213 or as pins 214, 215. These contact elements project inwardly in the direction of the valve-receiving member 1, when viewed from the inside of the cover. The plugs 212, 213 and pins 214, 215 projecting from the cover 2 correspond to the pins 107, 108 of the coil 103 and/or to the plugs 109, 110 of the coil 104.

Interposed between the cover 2 and the coils 103, 104 is a soft-rubber or rubber-sponge element 216, 217 which sealingly encloses the contact elements, that is, the plugs and pins, during the mounting of the cover 2 on the valve-receiving member 1. The rubber-sponge or soft-rubber elements 216, 217 are compressively loaded between cover 2 and coils 103, 104.

The cover 2 is furnished on the outside thereof with a contact device, more particularly a multiple-plug assembly 219. This multiple-plug assembly serves to establish the electrical contacts by way of a contact strip or plug assembly 218, for example, to the outlet side of an electronic control unit of an anti-lock braking system.

Terminating into the multiple-plug assembly 219 are the conductors or conducting paths formed of the brass sheet 111 which are accommodated in the cover and which constitute the connections to be connections to the contact elements of the coils 103, 104. In the area of its bottom edge, the cover 2 is provided with angle bars 220, 221 which are elastically outwardly displaceable.

Corresponding to the angle bars, the valve-receiving member 1 contains recessesd 222, 223 into which the angle bars engage when the cover is mounted on the valve block. In this manner the cover is anchored in the valve-receiving member.

The process of mounting the cover on the valve-receiving member is a follows: The cover is mounted on the valve-receiving member in a manner concentrically relative to the valve-receiving member, in particular to the plugs or pins fitted on the coils, and is displaced in the direction of the valve-receiving member. The above-described electrical contacts are established by this displacement. The lower edge of the cover overrides the upper edge of the valve-receiving member until the angle bars 220, 221 catch the recesses 222, 223 of the valve-receiving member. This way, a quick, simple and reliable mounting of the cover on the valve-receiving member is achieved. Soldering is not necessary, and screw coupling is superfluous as well. There is no need for special seals between the valve-receiving member and the cover. Nevertheless, the present invention accomplishes a good sealing relative to fumes, especially from the engine compartment, moisture and dirt. A high amount of removing force between valve-receiving member and cover is attained.

Only four embodiments of the present invention have been described. However, the instant invention is not restricted to the illustrated embodiments. Hence, the basic idea of this invention also can be realized by other electrical contact elements which establish the conntact by sliding one element on the other.

We claim:

1. A vehicle braking pressure regulating device comprising:
   a source of hydraulic fluid;
   a control circuit operative to receive certain parametric input signals and generate output command signals in response thereto; and
   a valve block assembly fluidically interconnecting said source and at least one vehicle wheel brake for selectively modulating braking pressure in response to said output command signals, said valve block including;
   at least one electromagnetically actuatable hydraulic valve defining at least one positionally fixed exposed electrical contact,
   a valve receiving member carrying said valve,
   a cover matingly mounted to said valve receiving member in a fixed positional relationship therewith and co-acting therewith to sealingly enclose said valve, and
   an electrically conductive network insulatively carried by said cover and including a mating contact positionally aligned with said valve contact for completion of an electrical circuit upon mounting of said cover upon said valve receiving member, an electrical interface operative to provide electrical connection of the control circuit to said network, and electrical conductors stamped from a generally planar sheet of conductive material interconnecting said mating contact and interface.

2. A vehicle braking pressure regulating device comprising:
   a source of hydraulic fluid;
   a control circuit operative to receive certain parametric input signals and generate output command signals in response thereto;
   at least one electromagnetically actuatable hydraulic valve defining at least one positionally fixed exposed electrical contact;
   a valve receiving member carrying said valve fluidically interconnected with said source and at least one vehicle wheel brake for selectively modulating braking pressure in response to said output command signals;
   a cover matingly mounted to said valve receiving member in a fixed positional relationship therewith and co-acting therewith to sealingly enclose said valve; and
   an electrically conductive network insulatively carried by said cover and including a mating contact positionally aligned with said valve contact for completion of an electrical circuit upon mounting of said cover upon said valve receiving member, an electrical interface operative to provide external access to said network, and at least one electrical conductor interconnecting said mating contact and interface, said mating contact and electrical conductor formed by stamping a generally planar sheet of conductive material.

3. The vehicle braking pressure regulating device of claim 2, wherein said valve receiving member comprises manifold defining fluid passageways adapted for interconnection with an external hydraulic circuit.

4. The vehicle braking pressure regulating device of claim 2, wherein said cover is formed of electrically insulating material.

5. The vehicle braking pressure regulating device of claim 4, wherein said electrically conductive network is injection molded in said cover.

6. The vehicle braking pressure regulating device of claim 2, further comprising means operative to continually bias said valve contact and mating contact into intimate contact whenever said cover is mounted to said valve receiving member.

7. The vehicle braking pressure regulating device of claim 2, wherein said valve contact is resiliently erect and operative to maintain itself in intimate contact with said mating contact whenever said cover is mounted to said valve receiving member.

8. The vehicle braking pressure regulating device of claim 2, wherein said mating contact is resiliently erect and operative to maintain itself in intimate contact with said valve contact whenever said cover is mounted to said valve receiving member.

9. The vehicle braking pressure regulating device of claim 2, wherein said electrically conductive network is attached by a fixing element on an inner surface of said cover.

10. The vehicle braking pressure regulating device of claim 9, wherein at least on said fixing element comprises a clip.

11. The vehicle braking pressure regulating device of claim 9, wherein at least one said fixing element comprises a snap hook.

12. The vehicle braking pressure regulating device of claim 9, wherein at least one said fixing element is integrally formed with the cover.

13. The vehicle braking pressure regulating device of claim 9, wherein at least one said fixing element is a press fastener.

14. The vehicle braking pressure regulating device of claim 2, wherein said contacts comprise contact pins and plugs shaped from said conductive material.

15. The vehicle braking pressure regulating device of claim 2, wherein the cover engages the valve-receiving member by a system of angle bars and recesses.

16. The vehicle braking pressure regulating device of claim 2, wherein the electric conductors in the cover are interlaced according to a predetermined wiring diagram and are in connection with a multiple plug assembly mounted on the outside of the cover.

17. The vehicle braking pressure regulating device of claim 2, further comprising resilient elements disposed intermediate said cover and valve to effect an inner sealed cavity for the electrical contacts.

18. A vehicle braking pressure regulating device comprising;
   a source of hydraulic fluid;
   a control circuit operative to receive certain parametric input signals and generate output command signals in response thereto;
   a plurality of electromagnetically actuable hydraulic valves, each said valve defining at least one exposed electrical contact;
   a valve receiving member carrying said valves in a fixed array, said member fluidically interconnected with said source and at least one vehicle wheel brake for selectively modulating braking pressure in response to said output command signals;
   a unitary cover matingly mounted to said valve receiving member in a fixed positional relationship therewith and co-acting therewith to sealingly enclose said valves; and
   an electrically conductive network insulatively carried by said cover and including a separate mating contact positionally aligned with each said valve contact for completion of an electrical circuit upon mounting of said cover upon said valve receiving member, an electrical interface operative to provide external access to said network, and electrical conductors stamped from a generally planar sheet of conductive material interconnecting said mating contacts and interface, whereby mounting of said cover upon said valve receiving member simultaneously establishes connection between all valve-mating contact pairs.

* * * * *